(12) United States Patent
Knoll et al.

(10) Patent No.: US 11,927,612 B1
(45) Date of Patent: Mar. 12, 2024

(54) DIGITAL DROOP DETECTOR

(71) Applicant: Marvell Asia Pte Ltd, Singapore (SG)

(72) Inventors: Ernest Knoll, Tirat Carmel (IL); Omer Yassur, Yokneam (IL)

(73) Assignee: Marvell Asia Pte Ltd, Singapore (SG)

( * ) Notice: Subject to any disclaimer, the term of this patent is extended or adjusted under 35 U.S.C. 154(b) by 0 days.

(21) Appl. No.: 18/048,018

(22) Filed: Oct. 19, 2022

Related U.S. Application Data

(60) Provisional application No. 63/328,548, filed on Apr. 7, 2022.

(51) Int. Cl.
```
G01R 25/00    (2006.01)
H03K 5/14     (2014.01)
H03L 7/00     (2006.01)
```

(52) U.S. Cl.
CPC ............ G01R 25/005 (2013.01); H03K 5/14 (2013.01); H03L 7/00 (2013.01)

(58) Field of Classification Search
None
See application file for complete search history.

(56) References Cited

U.S. PATENT DOCUMENTS

| | | | |
|---|---|---|---|
| 6,285,230 B1 | 9/2001 | Na | |
| 6,600,345 B1 | 7/2003 | Boutaud | |
| 6,686,785 B2 | 2/2004 | Liu et al. | |
| 6,882,238 B2 * | 4/2005 | Kurd | G01K 7/32 |
| | | | 331/74 |
| 7,145,831 B2 | 12/2006 | Goller et al. | |
| 7,551,909 B1 | 6/2009 | Moon et al. | |
| 7,764,095 B2 | 7/2010 | Werner et al. | |
| 7,952,404 B2 | 5/2011 | Petrie | |
| 7,971,088 B2 | 6/2011 | Jung et al. | |
| 9,425,779 B2 | 8/2016 | Jung | |
| 9,654,121 B1 | 5/2017 | Chu | |
| 10,162,373 B1 | 12/2018 | Chong et al. | |
| 10,530,370 B1 | 1/2020 | Mohan et al. | |
| 10,784,871 B1 * | 9/2020 | Xanthopoulos | H03L 7/0812 |
| 10,784,874 B1 | 9/2020 | Bang et al. | |

(Continued)

OTHER PUBLICATIONS

Senger, et al., "Low-Latency, HDL-Synthesizable Dynamic Clock Frequency Controller with Self-Referenced Hybrid Clocking," IEEE, Iscas 2006.

(Continued)

*Primary Examiner* — Cassandra F Cox
(74) *Attorney, Agent, or Firm* — Hamilton, Brook, Smith & Reynolds, P.C.

(57) ABSTRACT

A circuit detects a voltage droop exhibited by a power supply. A first signal delay line outputs a first delayed signal, and is comprised of delay elements having a first threshold voltage. A second delay line outputs a second delayed signal, and is comprised of delay elements having a second threshold voltage that is higher than the first threshold voltage. A phase detector compares the first and second delayed signals and outputs a comparison signal indicating which of the first and second signal delay lines exhibits a shorter delay. A reset circuit resets the first and second signal delay lines in response to the comparison signal, and a clock controller outputs a command to adjust a clock frequency or engage in other mitigation measures based on the comparison signal.

22 Claims, 7 Drawing Sheets

(56) References Cited

U.S. PATENT DOCUMENTS

| | | | |
|---|---|---|---|
| 11,527,956 B2 * | 12/2022 | Bertolini | H02M 3/158 |
| 2002/0079937 A1 | 6/2002 | Xanthopoulos | |
| 2002/0097592 A1 | 7/2002 | Komurasaki et al. | |
| 2004/0017234 A1 | 1/2004 | Tam et al. | |
| 2007/0170967 A1 | 7/2007 | Bae et al. | |
| 2007/0194815 A1 | 8/2007 | Nelson | |
| 2012/0068748 A1 | 3/2012 | Stojanovic et al. | |
| 2013/0238309 A1 | 9/2013 | Ting et al. | |
| 2014/0195081 A1 | 7/2014 | Kwak et al. | |
| 2014/0327478 A1 | 11/2014 | Horng et al. | |
| 2014/0347107 A1 | 11/2014 | Kim | |
| 2015/0162921 A1 | 6/2015 | Chen et al. | |
| 2015/0213873 A1 | 7/2015 | Joo et al. | |
| 2015/0277393 A1 | 10/2015 | Liu et al. | |
| 2015/0326231 A1 | 11/2015 | Thinakaran | |
| 2016/0013796 A1 | 1/2016 | Choi | |
| 2016/0077572 A1 | 3/2016 | Chang | |
| 2016/0351269 A1 | 12/2016 | Okuno et al. | |
| 2018/0351770 A1 | 12/2018 | Chiu et al. | |
| 2019/0007055 A1 | 1/2019 | Nelson | |
| 2020/0044657 A1 | 2/2020 | Pi et al. | |
| 2020/0076439 A1 | 3/2020 | Weeks et al. | |
| 2020/0076440 A1 | 3/2020 | Ng et al. | |
| 2020/0083891 A1 | 3/2020 | Huh et al. | |

OTHER PUBLICATIONS

Sidiropoulos, et al., "A Semidigital Dual Delay-Locked Loop," IEEE Journal of Solid-Slate Circuits, vol. 32, No. 11, Nov. 1997.

Zoni, et al., "A DVFS Cycle Accurate Simulation Framework with Asynchronous NoC Design for Power-Performance Optimizations," J. Sign. Process Syst., published online Mar. 24, 2015.

\* cited by examiner

DIGITAL DROOP DETECTOR

RELATED APPLICATION

This application claims the benefit of U.S. Provisional Application No. 63/328,548, filed on Apr. 7, 2022. The entire teachings of the above application are incorporated herein by reference.

BACKGROUND

Modern integrated circuits often comprise multiple processor cores and other components that share a common power supply. In typical operations, the power consumed by the processor cores and other components varies over time according to the work being done. In particular, a rapid increase in the activity of a processor core can cause a similarly rapid increase in power demand to that core. The power supply, given its physical limitations, may be unable to provide this rapid power increase while also maintaining power at a constant voltage to all serviced components. As a result, the power supply may exhibit a transient drop in voltage, often referred to as a voltage droop. To address voltage droop, typical integrated circuits include circuitry to carry out mitigation measures, such as lowering the clock frequency of the integrated circuit, in response to detecting a voltage droop.

SUMMARY

Example embodiments include a circuit for detecting a voltage droop. A first signal delay line may be configured to output a first delayed signal and may be comprised of delay elements having a first threshold voltage. A second delay line may be configured to output a second delayed signal and may be comprised of delay elements having a second threshold voltage that is higher than the first threshold voltage. A phase detector may be configured to compare the first and second delayed signals and output a comparison signal indicating which of the first and second signal delay lines exhibits a shorter delay. A reset circuit may be configured to reset the first and second signal delay lines in response to the comparison signal, and a clock controller may be configured to output a command to adjust a clock frequency based on the comparison signal.

The first delay line may output the first delayed signal with a first delay that varies based on common operational voltage. The second delay line may output the second delayed signal with a second delay that varies based on the common operational voltage, the first and second delays being distinct from one another. The first and second delay lines may each exhibit a delay that varies distinctly from one another in response to a voltage drop of the common operational voltage. The delay elements of the first and second delay lines may be built from or otherwise include devices (e.g., MOSFETs) having the first and second threshold voltages, respectively.

The first and second delay lines may each have a respective delay that is adjustable based on a calibration process. A calibration circuit may be configured to 1) apply a target voltage code to a lookup table cross-referencing reference voltages and reference delay control values, and 2) cause the delay of the first and second delay lines to be adjusted based on a match between the target voltage and the lookup table. Once the voltage of the external power supply is set, the delay of the delay lines may be adjusted to be equal (e.g., one is set to a fixed delay, and the delay of the other may be modified until the first delay line becomes shorter and the detector output is toggled. The calibration circuit may then store the delay configuration together with a voltage digital code in a look up table, wherein the calibration voltage is informed by the code of the current operating voltage. This process may be repeated for several voltages. Then, during normal operation of the detector, when the power supply is changing voltage, the operating voltage code may be sent to the look up table. The lookup table may output the calibration values for the delay lines that are stored for the specific voltage.

The first and second delay lines may be configured to exhibit an equal delay at a target operational voltage. A clock controller may be configured to adjust the clock frequency based on the command. The circuit may also be implemented in a system-on-chip (SOC) comprising a plurality of devices including the circuit, the plurality of devices sharing a common power supply. The SOC may be configured to adjust an operational clock frequency of the plurality of devices based on the command.

Further embodiments include a method of detecting a voltage droop. A first delayed signal may be generated via elements having a first threshold voltage, and a second delayed signal may be generated via elements having a second threshold voltage that is higher than the first threshold voltage. The first and second delayed signals may be compared, and a comparison signal may be output indicating which of the first and second signal delay lines exhibits a shorter delay. The first and second signal delay lines may then be reset in response to the comparison signal, and a command to adjust a clock frequency may be generated based on the comparison signal.

The first delayed signal may exhibit a first delay that varies based on common operational voltage. The second delayed signal may exhibit a second delay that varies based on the common operational voltage, the first and second delays being distinct from one another. The first and second delay signals may each exhibit a delay that varies distinctly from one another in response to a voltage drop of the common operational voltage. Further, the delays of the first and second delay signals may change differently when the voltage changes, such as when the SOC moves to a different operating voltage. For this reason, the detector may be calibrated at multiple voltages, and when the voltage changes, the detector may respond by applying the calibration configuration that corresponds to the new operating voltage.

The first and second delay signals may each exhibit a respective delay that is adjustable based on a calibration process. In an example adjustment process, a target voltage code may be applied to a lookup table cross-referencing reference voltages and reference delay control values; and the delay of the first and second delay signals may be adjusted based on a match between the target voltage and the lookup table. The first and second delay signals may exhibit an equal delay at a threshold operational voltage.

The clock frequency may be adjusted based on the command. The method may also be implemented in a system-on-chip (SOC) comprising a plurality of devices sharing a common power supply. An operational clock frequency of the plurality of devices may be adjusted based on the command.

BRIEF DESCRIPTION OF THE DRAWINGS

The foregoing will be apparent from the following more particular description of example embodiments, as illus

DETAILED DESCRIPTION

A description of example embodiments follows.

Figure 1:
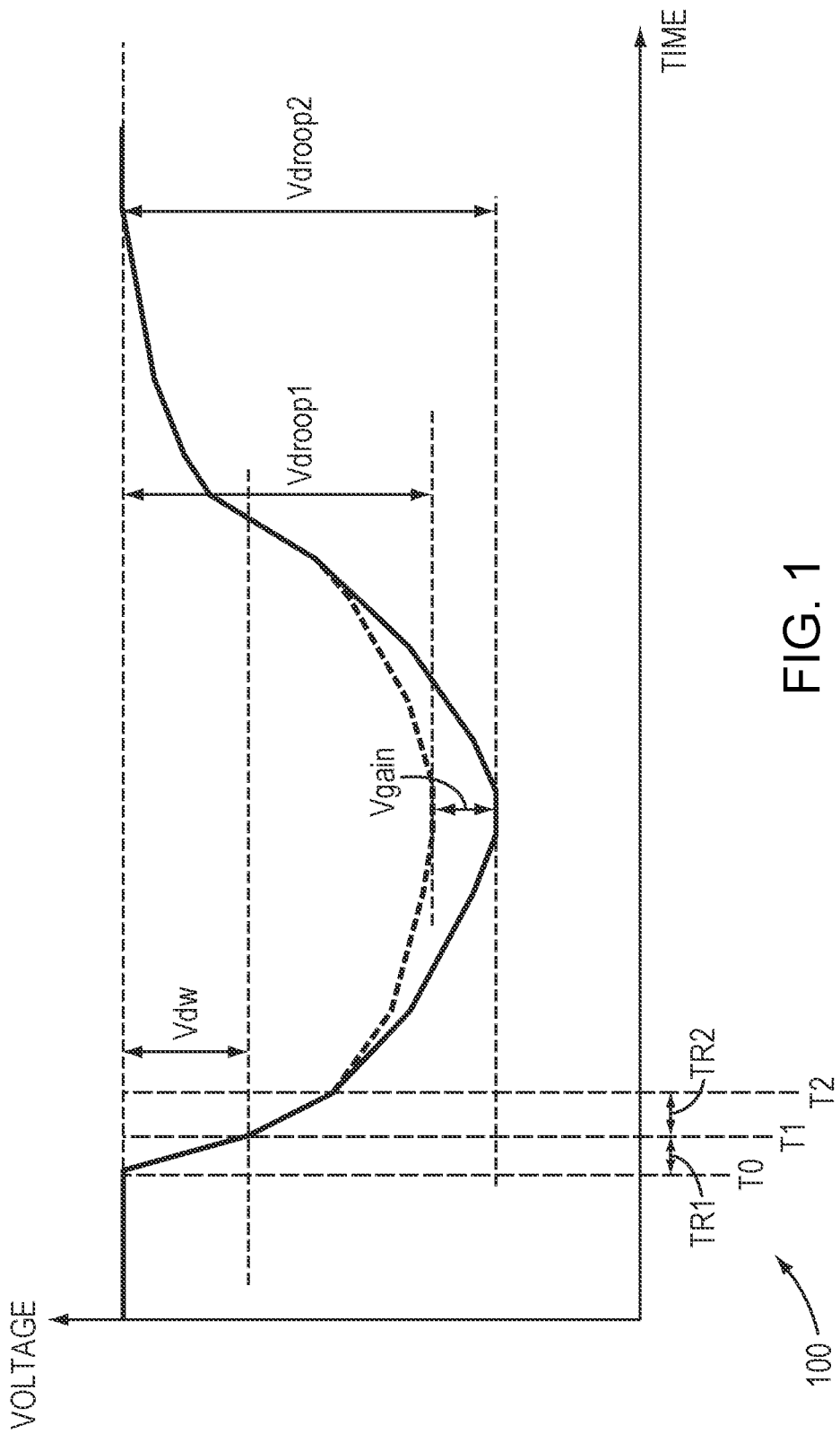
- FIG. 1 is a plot depicting voltage over time during a voltage droop event.

FIG. 1 is a plot depicting voltage over time during a voltage droop event. In an integrated circuit including one or more processor cores, core activity events may create high and fast increase in current consumption, which may be expressed as a change in current (I) over time (t): dI/dt. A high dI/dt may cause a droop in the voltage supplied to the processor cores and/or other components of the circuit due to the response time of the system voltage regulator or the impedance of a power delivery path. Such voltage droops may also occur in local areas of the circuit due to the resistance of power delivery lines and low density of on-board discrete decoupling capacitors.

Typical droop mitigation techniques involve lowering a clock frequency of the circuit, which may be global or specific to a subset of components. Droop mitigation can improve the power performance of the circuit by reducing the required frequency margin of the affected components, thereby allowing the components to run faster and with higher performance. Operating at the same frequency, faster components can use lower voltage, thereby consuming less power.

Figure 2:
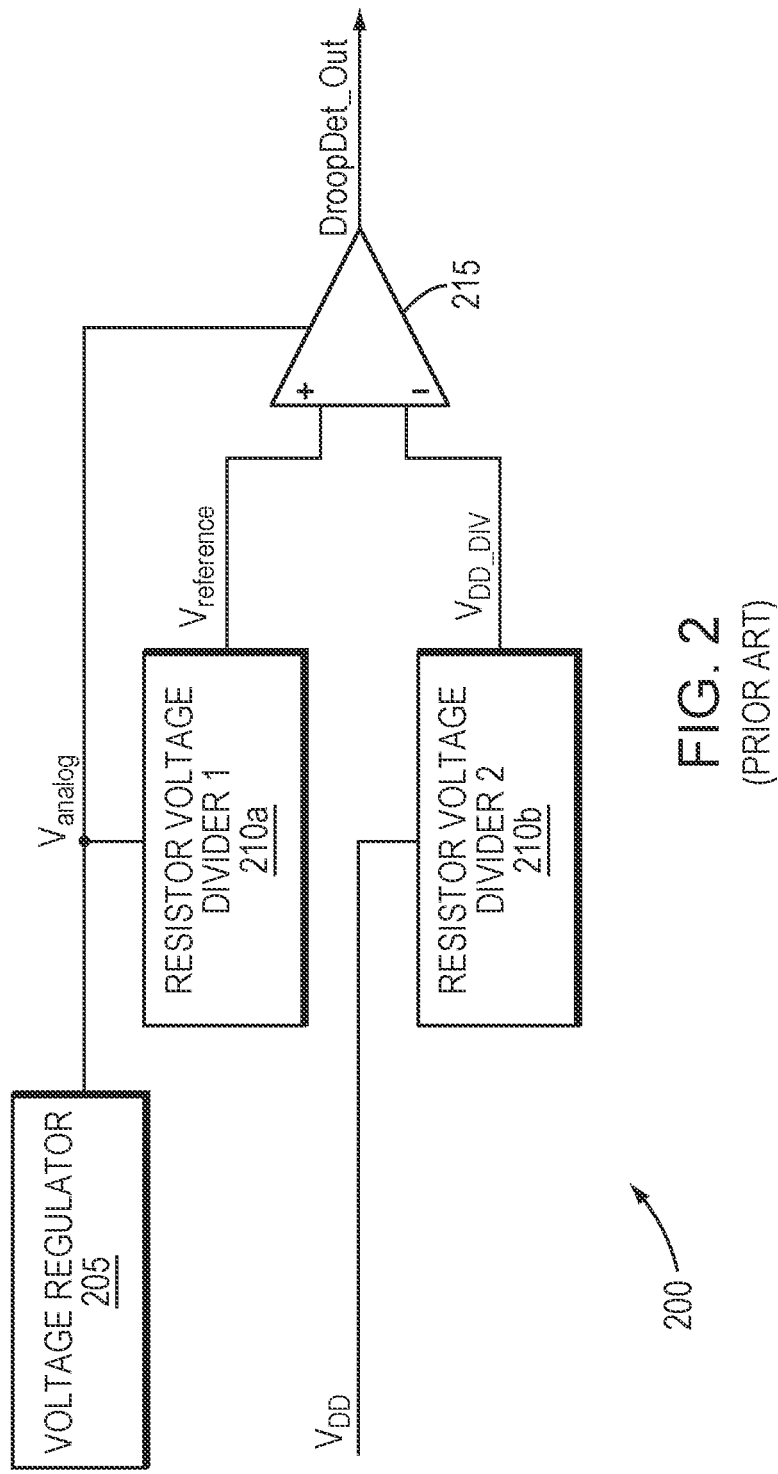
FIG. 2 is a diagram of a prior-art droop detector.

FIG. 2 is a diagram of a prior-art droop detector 200. An objective of such a detector is to detect voltage droops and send a corresponding warning signal to a clock generator to lower a clock frequency of the circuit. A lower clock frequency to the power-consuming components of the circuit, in turn, can lower the current to those components, thereby reducing the detected voltage droop. Further, the lower supply voltage during a droop can increase the delay of signal propagation throughout the circuit. If the clock frequency remains the same during such an event, this delay leaves less time for the receipt of propagated signal within and/or between components, thereby leading to timing failures. Thus, by lowering clock frequency as a result of droop detection, a circuit can also prevent circuit components from exhibiting timing failures by better synchronizing the clock frequency for an anticipated delay. Once the measured voltage is detected to have returned to a target or threshold voltage, a droop detector can issue a signal to the clock generator to resume the previous frequency prior to the voltage droop.

The droop detector 200 includes a voltage regulator 205 to output an analog supply voltage $V_{analog}$, which is received by a first resistor voltage divider 210a to generate a corresponding reference voltage $V_{reference}$. The analog supply voltage $V_{analog}$ may be a stable voltage that is largely unaffected by the changes in voltage of a system power supply. A second resistor voltage divider 210b receives the power supply voltage $V_{DD}$ and outputs a corresponding divided supply voltage $V_{DD\_DIV}$. The resistor voltage dividers 210a-b may be are set to ensure that $V_{reference}$ and $V_{DD\_DIV}$ are equal at the operating voltage of $V_{DD}$. During a droop event, $V_{DD\_DIV}$ may become lower and the comparator output DroopDet_Out may toggle. An analog comparator 215 compares the outputs of each divider 120a-b and outputs a droop detection signal DroopDet_Out indicating whether $V_{DD}$ is below the target voltage.

A droop detector can be employed in multiple scenarios. In one scenario, droop detection can enable an increased maximum bin frequency, wherein circuit components consistently operate at a maximum $V_{DD}$. Here, faster components can operate at a higher frequency, resulting in higher performance. In another scenario, droop detection can enable power savings, wherein all components operate at the same frequency, and faster units can operate at a lower voltage, thereby saving power.

Figure 3A:
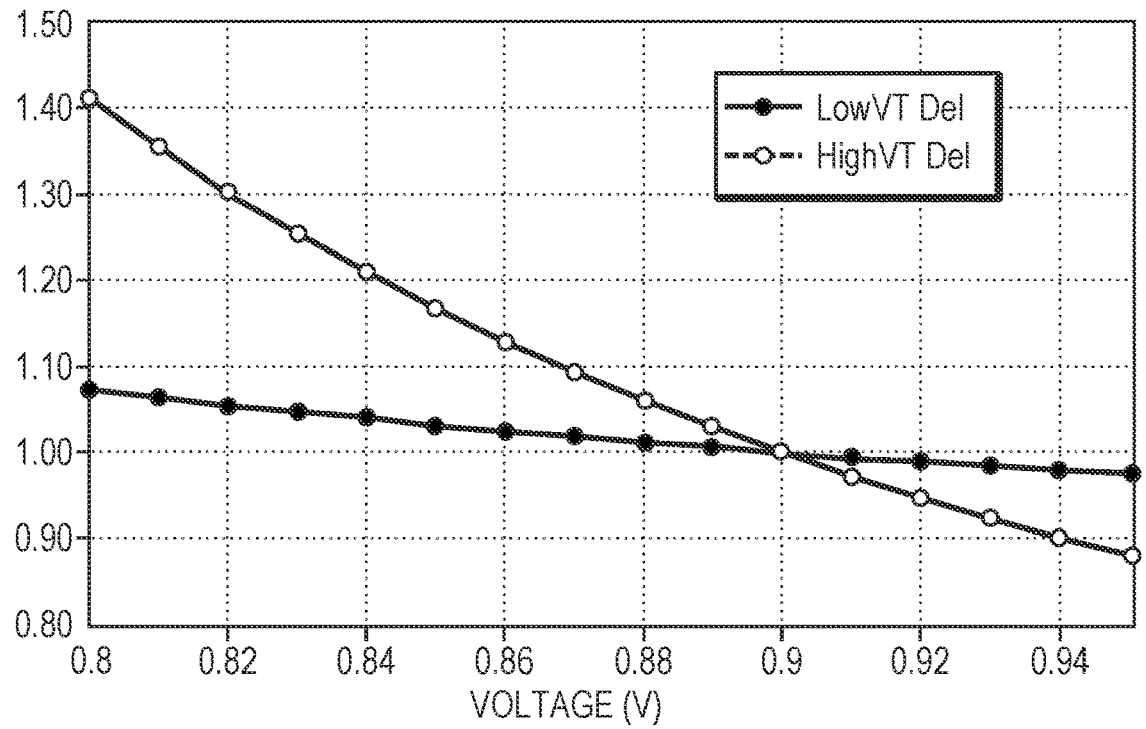
FIGS. 3A-B are plots depicting delay as a function of voltage for two different delay paths in one embodiment.
Figure 3B:
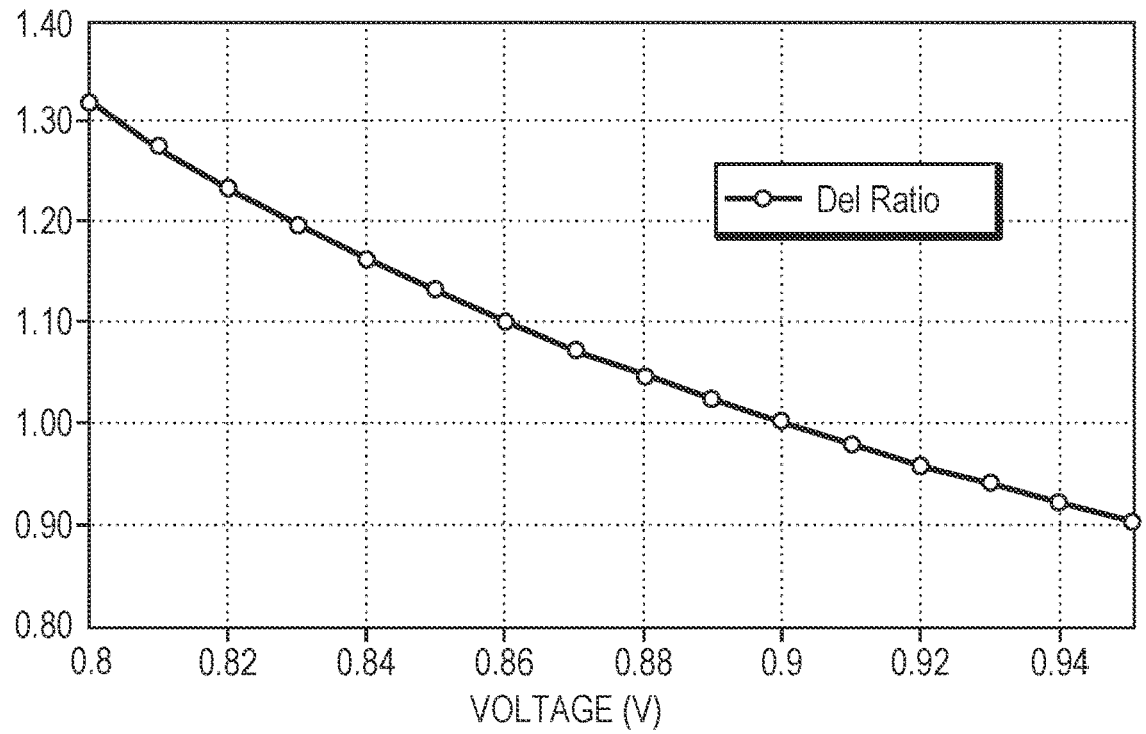

FIGS. 3A-B are plots depicting delay as a function of voltage for two different example signal delay lines. The delay lines are distinct in that they are constructed from devices having different threshold voltages $V_T$, wherein lower threshold voltages constitute faster devices. In this example, a first delay line exhibits a relatively low $V_T$ (LowVt Del) and a second delay line exhibits a relatively high $V_T$ (HighVt Del). FIG. 3A shows the delay of the two delay lines as a function of voltage, normalized to 0.9V, while FIG. 3B shows the ratio of the delay among the two delay paths as a function of voltage. As can be seen, the higher threshold voltage delay line exhibits a higher sensitivity to variation in voltage than the lower threshold delay line. Thus, the plots demonstrate that delay voltage sensitivity is different for paths with different threshold voltage devices.

In the example shown, the delay of the lower $V_T$ line increases by ~10% while the higher $V_T$ line delay increases by ~60% for the same voltage decrease. This behavior allows the detection of a specific voltage threshold. Specifically, provided that the delay lines have equal delay at a specific voltage, then 1) at a higher voltage, the higher $V_T$ line delay is shorter, and 2) at a lower voltage, the lower $V_T$ line delay is shorter. This principle can be applied to detection of voltage droop as described below.

Figure 4:
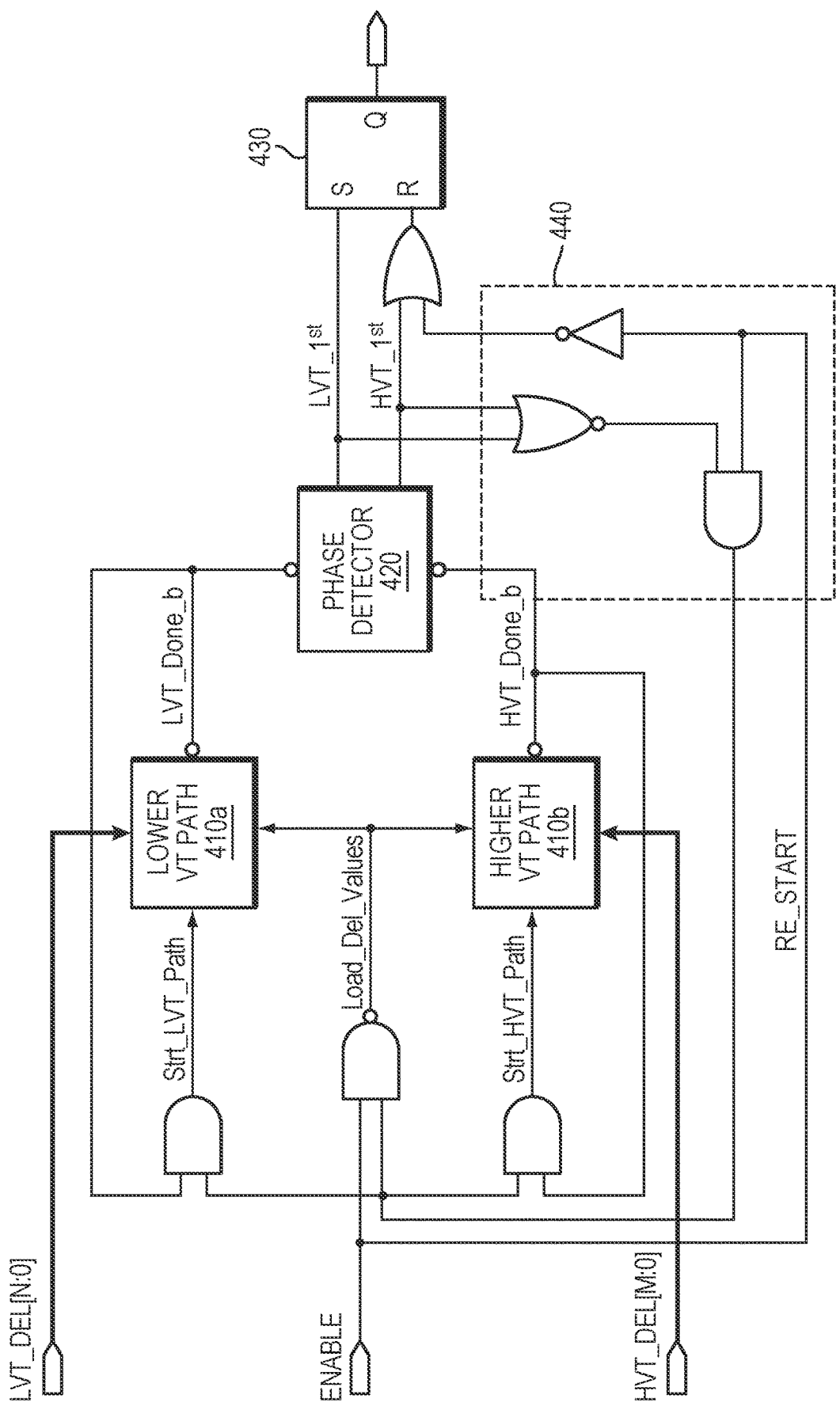
FIG. 4 is a circuit diagram of a droop detector in one embodiment.

FIG. 4 is a circuit diagram of a voltage droop detector 400 in an example embodiment. The detector 400 may include a first signal delay line 410a configured to output a first delayed signal (LVT_Done_b), and may be comprised of delay elements including devices (e.g., MOSFETs) having a first (lower) threshold voltage. A second delay line 410b may be configured to output a second delayed signal (HVT_Done_b), and may be comprised of delay elements including devices having a second (higher) threshold voltage. A phase detector 420 may be configured to compare the first and second delayed signals and output a comparison signal (LVT_1$^{st}$ or HVT_1$^{st}$) indicating which of the first and second signal delay lines exhibits a shorter delay. A reset circuit 440 may be configured to reset the first and second signal delay lines 410a-b in response to the comparison signal, and a clock controller 430 (e.g., a set-reset latch) may be configured to output a command Q to adjust a clock frequency based on the comparison signal.

The delays of the signal delay lines 410a-b may be programmable, and can be programmed (e.g., via a calibration process, described below) to have equal delay at a target detection voltage. When an operational voltage ($V_{DD}$)

decreases below this target voltage, the delay of the higher $V_T$ delay line (410b) increases more than the delay of the lower $V_T$ delay line (410a). Thus, the target voltage may be set as a threshold voltage for identifying a voltage droop, wherein an operating voltage of less than the threshold is to be detected as a voltage droop. Example delay control inputs to each delay line 410a-b are shown in FIG. 4 as LVT_DEL [N:0] for the lower $V_T$ delay line 410a and HVT_DEL[M:0] for the higher $V_T$ delay line. Due to the operation of the reset circuit 440, the delay line with the shortest delay ends a voltage detection cycle and re-starts the next voltage detection cycle (e.g., via the RE_START signal).

Figure 5:
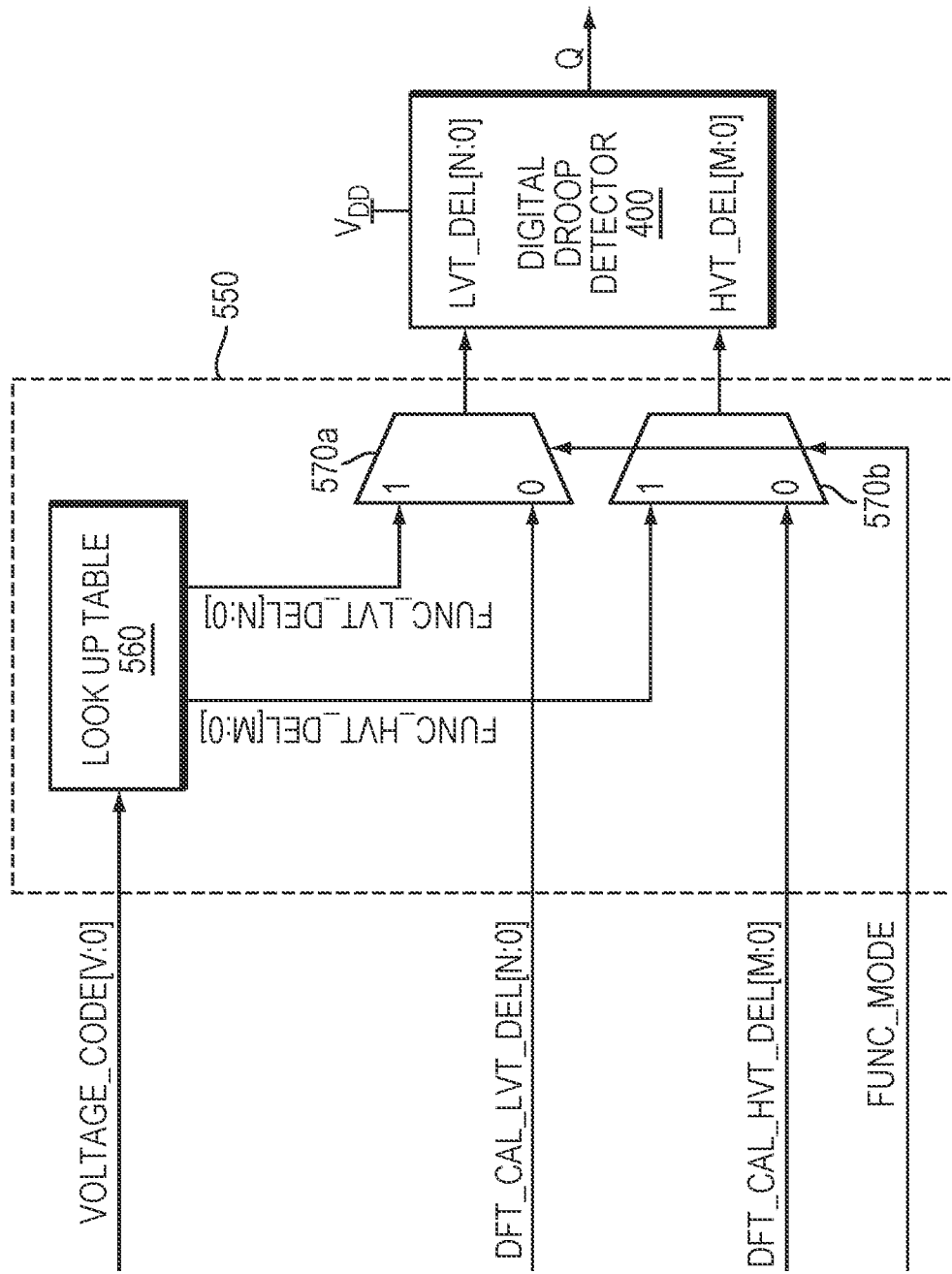
FIG. 5 is a diagram of a calibration circuit in connection with a droop detector in one embodiment.

FIG. 5 is a diagram of a calibration circuit 550 in connection with a voltage droop detector 400 described above. The calibration circuit 550 may include 1) a lookup table 560, which may include a table cross-referencing reference voltages and reference delay line control values, as well as corresponding control circuitry; and 2) a pair of multiplexers 570a-b configured to output the respective calibration control signals LVT_DEL[N:0] and HVT_DEL [M:0] described above. To compensate for process variation and other factors, the droop detector 400 may benefit from calibration to ensure the delay lines 410a-b are equal at a target voltage (also referred to as the droop detection voltage). Calibration can be performed during testing (e.g., via automatic test equipment (ATE) under design for testing (DFT) software control).

With reference to FIG. 5, in an example calibration process, the FUNC_MODE input may toggle the calibration circuit 550 and detector 400 between a calibration mode and a functional mode for normal detection operations. Thus, to begin a calibration process, the FUNC_MODE input may be set to 0 (i.e., the calibration mode), and the $V_{DD}$ voltage to the detector 400 may be set to the desired threshold voltage (also referred to as a detection voltage). The threshold voltage, as described above, may be the lower than the functional $V_{DD}$ voltage to avoid false alarms due to tolerable voltage fluctuations. Then, DFT CAL LVT_DEL[N:0] and DFT CAL HVT_DEL[M:0] may be modified until the detector 400 output Q toggles to 1. Once this occurs, the corresponding values for DFT CAL LVT_DEL[N:0] and DFT CAL HVT_DEL[M:0] may be stored in the look-up table 560 to be used for droop detection in the functional mode. The calibration process may be repeated to obtain a plurality of different values corresponding to different respective threshold values, all of which may be stored to the look-up table 560 for use with different expected functional $V_{DD}$ values during the functional mode.

Following the calibration process, the detector 400 may enter the functional mode to detect voltage droops exhibited by $V_{DD}$. For example, the FUNC_MODE input may be set to 1 to toggle the functional mode. To set a specific threshold voltage, a Voltage_Code[V:0], which may indicate either the operational $V_{DD}$ voltage or the corresponding threshold voltage, may be input to the look-up table 560. Accordingly, the look-up table may output the corresponding FUNC_LVT_DEL[N:0] and FUNC_HVT_DEL[M:0] values to the detector 400, which are received as the delay control inputs to each delay line 410a-b (LVT_DEL[N:0] and HVT_DEL[M:0]). In one embodiment, the look-up table 560 may store values for limited number of threshold voltages (e.g., 2 or 3), and the look-up table 560 may include circuitry for determining interpolated values for FUNC_LVT_DEL[N:0] and FUNC_HVT_DEL[M:0] based on the stored values and Voltage_Code[V:0]. Once the delay control inputs are established for the detector 400, the detector 400 may proceed to detect voltage droop as described below with reference to FIG. 6.

Figure 6:
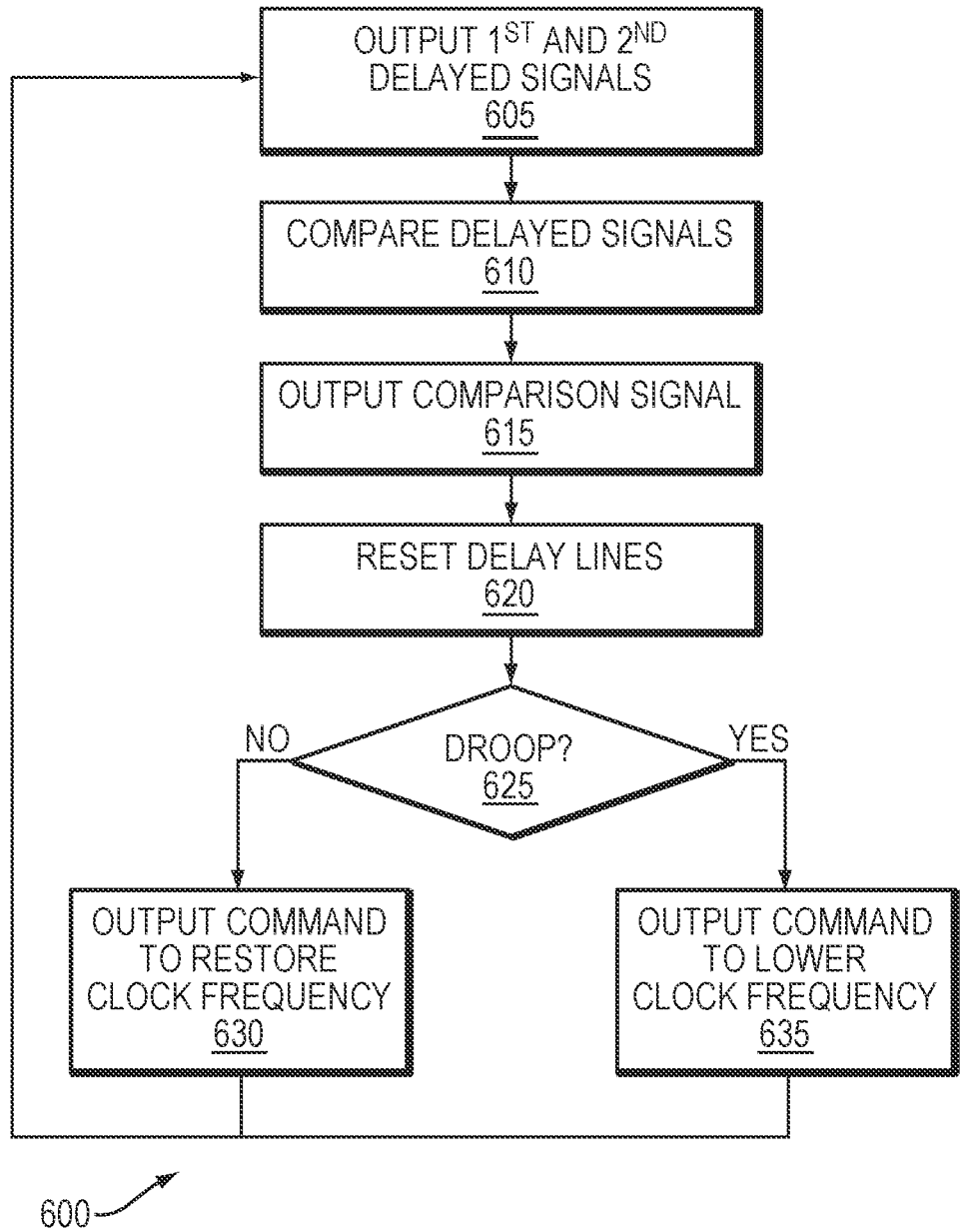
FIG. 6 is a flow diagram of a process of detecting a voltage droop in one embodiment.

FIG. 6 is a flow diagram of a process 600 of detecting a voltage droop in one embodiment. With reference to FIG. 4, at the beginning of a detection cycle, the first and second delay lines 410a-b may each output a respective delayed signal (LVT_Done_b, HVT_Done_b) with a timing based on the programmed delay values (LVT_DEL[N:0] and HVT_ DEL[M:0]) and the voltage being measured ($V_{DD}$) (605). The phase detector 420 may compare the first and second delayed signals (610) and output a comparison signal (LVT_$1^{st}$ or HVT_$1^{st}$) indicating which of the first and second signal delay lines exhibits a shorter delay (615). The reset circuit 440 may receive the comparison signal, which indicates the completion of a detection cycle, and reset the first and second signal delay lines 410a-b (620). Because the comparison signal indicates which delay line exhibits a shorter delay, it also indicates whether the measured voltage $V_{DD}$ exhibits a voltage droop (625). For example, LVT_$1^{st}$ may indicate a voltage droop, and HVT_$1^{st}$ may indicate a voltage above the threshold voltage. Accordingly, the clock controller 430 may output the command Q that indicates whether to lower the clock frequency in response to a voltage droop (635) or restore the clock frequency to a default operational value (630) once the voltage exceeds the threshold value (630). The process 600 may then be repeated over subsequent detection cycles.

Figure 7:
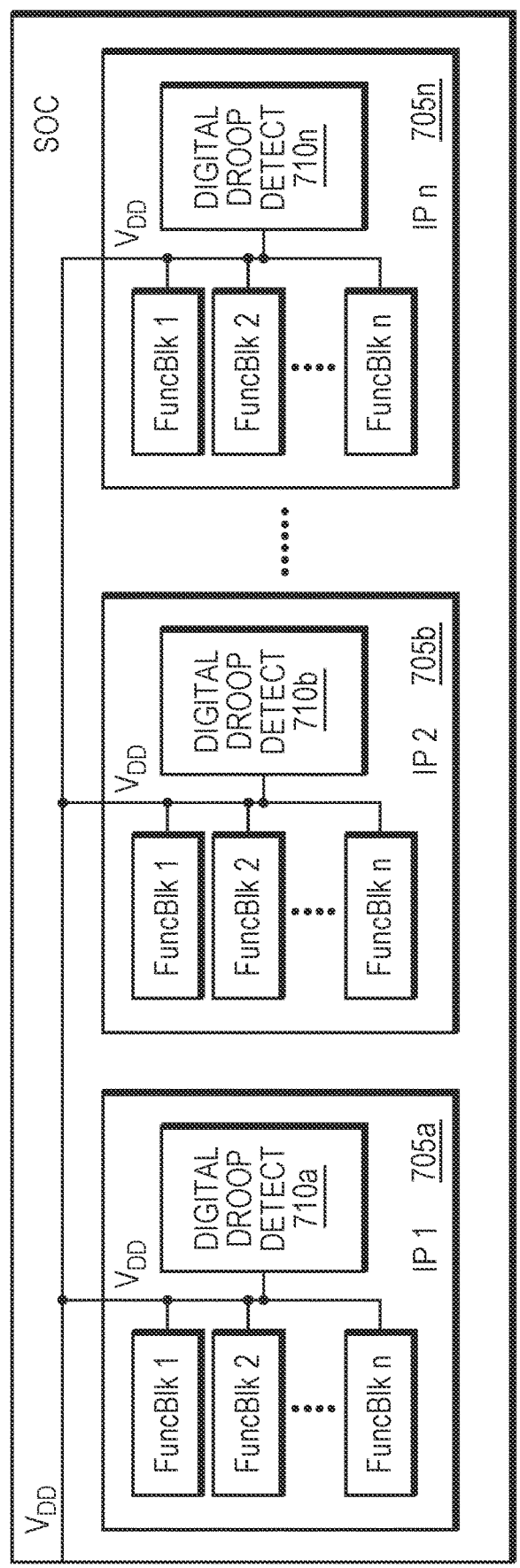
FIG. 7 is a diagram of a system-on-chip (SOC) implementing a plurality of droop detectors in one embodiment.

FIG. 7 is a diagram of a system-on-chip (SOC) 700 implementing a plurality of voltage droop detectors 710a-n. The SOC 700 may integrate a plurality of integrated processors 705a-n, each of which may be an integration of a number of functional processing blocks (FuncBlk 1-n) as shown. At the SOC level, some or all of the integrated processors 705a-n may share a common power supply $V_{DD}$. Each integrated processor 705a-n may also integrate respective one of the voltage droop detectors 710a-n, which share the same power supply $V_{DD}$ as the functional processing blocks. Thus, each of the voltage droop detectors 710a-n can sense a droop event, including those caused by functional processing blocks at a remote integrated processor 705a-n.

While example embodiments have been particularly shown and described, it will be understood by those skilled in the art that various changes in form and details may be made therein without departing from the scope of the embodiments encompassed by the appended claims.

What is claimed is:

1. A circuit, comprising:
    a first signal delay line configured to output a first delayed signal, the first signal delay line being comprised of delay elements having a first threshold voltage;
    a second signal delay line configured to output a second delayed signal, the second delay line being comprised of delay elements having a second threshold voltage that is higher than the first threshold voltage;
    a phase detector configured to compare the first and second delayed signals and output a comparison signal indicating which of the first and second signal delay lines exhibits a shorter delay;
    a reset circuit configured to reset the first and second signal delay lines in response to the comparison signal; and
    a clock controller configured to output a command to adjust a clock frequency based on the comparison signal.

2. The circuit of claim 1, wherein the first delay line outputs the first delayed signal with a first delay that varies based on common operational voltage.

3. The circuit of claim 2, wherein the second delay line outputs the second delayed signal with a second delay that varies based on the common operational voltage, the first and second delays being distinct from one another.

4. The circuit of claim 1, wherein the first and second delay lines each exhibit a delay that varies distinctly from one another in response to a voltage drop of the common operational voltage.

5. The circuit of claim 1, wherein the first and second delay lines each have a respective delay that is adjustable based on a calibration process.

6. The circuit of claim 5, further comprising a calibration circuit configured to:
apply a target voltage code to a lookup table cross-referencing reference voltages and reference delay control values; and
cause the delay of the first and second delay lines to be adjusted based on a match between the target voltage and the lookup table.

7. The circuit of claim 5, wherein the first and second delay lines are configured to exhibit an equal delay at a threshold operational voltage.

8. The circuit of claim 1, further comprising a clock controller configured to adjust the clock frequency based on the command.

9. The circuit of claim 1, implemented in a system-on-chip (SOC) comprising a plurality of devices including the circuit, the plurality of devices sharing a common power supply.

10. The circuit of claim 8, wherein the SOC is configured to adjust an operational clock frequency of the plurality of devices based on the command.

11. The circuit of claim 1, wherein the delay elements of the first signal delay line and the delay elements of the second signal delay line include devices having the first and second threshold voltages, respectively.

12. A method, comprising:
generating a first delayed signal via delay elements having a first threshold voltage;
generating a second delayed signal via delay elements having a second threshold voltage that is higher than the first threshold voltage;
comparing the first and second delayed signals and outputting a comparison signal indicating which of the first and second signal delay lines exhibits a shorter delay;
resetting the first and second signal delay lines in response to the comparison signal; and
generating a command to adjust a clock frequency based on the comparison signal.

13. The method of claim 12, wherein the first delayed signal exhibits a first delay that varies based on common operational voltage.

14. The method of claim 13, wherein the second delayed signal exhibits a second delay that varies based on the common operational voltage, the first and second delays being distinct from one another.

15. The method of claim 12, wherein the first and second delay signals each exhibit a delay that varies distinctly from one another in response to a voltage drop of the common operational voltage.

16. The method of claim 12, wherein the first and second delay signals each exhibit a respective delay that is adjustable based on a calibration process.

17. The method of claim 16, further comprising:
applying a target voltage code to a lookup table cross-referencing reference voltages and reference delay control values; and
causing the delay of the first and second delay signals to be adjusted based on a match between the target voltage and the lookup table.

18. The method of claim 16, wherein the first and second delay signals exhibit an equal delay at a threshold operational voltage.

19. The method of claim 12, further comprising adjusting the clock frequency based on the command.

20. The method of claim 12, implemented in a system-on-chip (SOC) comprising a plurality of devices sharing a common power supply.

21. The circuit of claim 8, further comprising adjusting an operational clock frequency of the plurality of devices based on the command.

22. A circuit, comprising:
means for generating a first delayed signal via delay elements having a first threshold voltage;
means for generating a second delayed signal via delay elements having a second threshold voltage that is higher than the first threshold voltage;
means for comparing the first and second delayed signals and outputting a comparison signal indicating which of the first and second signal delay lines exhibits a shorter delay;
means for resetting the first and second signal delay lines in response to the comparison signal; and
means for generating a command to adjust a clock frequency based on the comparison signal.

* * * * *